United States Patent

Miller et al.

(10) Patent No.: US 9,495,179 B1
(45) Date of Patent: Nov. 15, 2016

(54) MOBILE USER OBJECTIVE SYSTEM GROUND BASE STATION EMULATION SYSTEM AND RELATED METHOD

(71) Applicant: Rockwell Collins, Inc., Cedar Rapids, IA (US)

(72) Inventors: Sarah A. Miller, Cedar Rapids, IA (US); Ryan J. Coppa, Cedar Rapids, IA (US); Robert J. Mourlam, Cedar Rapids, IA (US); Christopher K. Ridgway, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 906 days.

(21) Appl. No.: 13/849,647

(22) Filed: Mar. 25, 2013

(51) Int. Cl.
*G06F 9/455* (2006.01)

(52) U.S. Cl.
CPC .................................... *G06F 9/455* (2013.01)

(58) Field of Classification Search
CPC ....................................................... G06F 9/455
USPC ..................................... 703/23, 24; 455/423
See application file for complete search history.

(56) References Cited

U.S. PATENT DOCUMENTS

| | | | | |
|---|---|---|---|---|
| 6,571,370 | B2* | 5/2003 | Kim | G06F 17/5027 703/23 |
| 7,734,288 | B1* | 6/2010 | Jensen | H04B 7/18506 455/41.2 |
| 2008/0070601 | A1* | 3/2008 | Brueckheimer | H04W 4/14 455/466 |
| 2011/0252154 | A1* | 10/2011 | Bunch | H04M 3/4217 709/230 |

* cited by examiner

*Primary Examiner* — Eunhee Kim
(74) *Attorney, Agent, or Firm* — Angel N. Gerdzhikov; Donna P. Suchy; Daniel M. Barbieri

(57) ABSTRACT

A method and related system is disclosed for emulation of a Mobile User Objective System (MUOS) ground base station. A Software Defined Radio (SDR) based architecture with interpreted scripting languages interfaces with open source software running in an embedded environment to emulate entire MUOS ground transportation segment. The ground base station emulation resides on a server remote from the MUOS enabled terminals or embedded within MUOS enabled terminals. It is transparent to the MUOS enabled terminal whether the terminal is in communication with the emulation of or the actual MUOS ground base station.

20 Claims, 4 Drawing Sheets

MOBILE USER OBJECTIVE SYSTEM GROUND BASE STATION EMULATION SYSTEM AND RELATED METHOD

FIELD OF THE INVENTION

The present invention relates generally to mobile radio systems and testing thereof. More particularly, embodiments of the present invention relate to a system and method for software defined emulation of a mobile user objective system ground base station within a single and distributed host platform.

BACKGROUND OF THE INVENTION

A Mobile User Objective System (MUOS) enabled terminal requires a ground base station to communicate via the MUOS waveform with a second MUOS enabled terminal. The specialized MUOS waveform requires continuous interaction with the ground base station infrastructure which prohibits individual waveform porting and MUOS terminal integration. Traditionally, expensive actual ground base station hardware and proprietary software is required to test and communicate between MUOS enabled terminals. Operators desiring porting of the MUOS waveform are therefore without an alternative ability to connect with and test a MUOS enabled radio or terminal.

Consequently, a need remains for an alternative to expensive hardware and the proprietary software required to evaluate and communicate with a MUOS enabled terminal.

SUMMARY OF THE INVENTION

Accordingly, an embodiment of the present invention is directed to a method for emulation of a mobile user objective system ground base station, comprising, configuring a mobile user objective system enabled terminal for communication with a mobile user objective system ground base station emulation server, the mobile user objective system enabled terminal configuring including, an instance of a mobile user objective system waveform, an instance of a layer one, the instance of the layer one including an emulation of a digital signal processor and an emulation of a field-programmable gate array, configuring the mobile user objective system ground base station emulation server for communication with at least one configured mobile user objective system enabled terminal, the mobile user objective system ground base station emulation server configuring including, an implementation of a generic discovery client server, an implementation of an internet key exchange session manager, an implementation of a session initiation protocol server, and an emulation of a ground base station, the emulation of the ground base station including an emulation of a radio base station and an emulation of a radio network controller, wherein the mobile user objective system enabled terminal communicates via the instance of the mobile user objective system waveform and the instance of the layer one with the mobile user objective system ground base station emulation server, the communication emulates an actual communication with an actual mobile user objective system ground base station.

Additional embodiments of the present invention provide for autonomous communication and testing with a mobile user objective system ground base station emulation residing within the mobile user objective system terminal, the mobile user objective system enabled terminal configuring including, an implementation of a generic discovery client server, an implementation of an internet key exchange session manager, an implementation of a session initiation protocol server, and an emulation of a ground base station, the emulation of the ground base station including an emulation of a radio base station and an emulation of a radio network controller.

Additional embodiments of the present invention provide for an instance of a wideband code division multiple access waveform and a ground base station emulation requiring no change to the mobile user objective system waveform to alternate between communication with the emulation of the mobile user objective system ground base station and communication with an actual mobile user objective system ground base station.

Additional embodiments of the present invention provide for a separate host processor, the separate host processor configured for data communication with the mobile user objective system enabled terminal and the actual mobile user objective system ground base station is one of four worldwide ground base stations.

Additional embodiments of the present invention provide a mobile user objective system enabled terminal configured to communicate with another of the mobile user objective system enabled terminal.

Additional embodiments of the present invention provide a system for emulation of a mobile user objective system ground base station, comprising, a mobile user objective system enabled terminal configured for communication with a mobile user objective system ground base station emulation server, the mobile user objective system enabled terminal including a terminal non-transitory computer readable medium having terminal computer readable program code embodied therein for emulation of a mobile user objective system ground base station, the terminal computer readable program code comprising instructions which, when executed by a terminal processor, instantiate, an instance of a mobile user objective system waveform, an instance of a layer one, the instance of the layer one including an emulation of a digital signal processor and an emulation of a field-programmable gate array, the mobile user objective system ground base station emulation server configured for communication with at least one configured mobile user objective system enabled terminal, the mobile user objective system ground base station emulation server including a server non-transitory computer readable medium having server computer readable program code embodied therein for emulation of a mobile user objective system ground base station, the server computer readable program code comprising instructions which, when executed by a server processor, instantiate, an implementation of a generic discovery client server, an implementation of an internet key exchange session manager, an implementation of a session initiation protocol server, and an emulation of a ground base station, the emulation of the ground base station including an emulation of a radio base station and an emulation of a radio network controller, wherein the mobile user objective system enabled terminal communicates via the instance of the mobile user objective system waveform and the instance of the layer one with the mobile user objective system ground base station emulation server, the communication emulates an actual communication with an actual mobile user objective system ground base station.

Additional embodiments of the present invention provide a non-transitory computer readable medium having computer readable program code embodied therein for emulation of a mobile user objective system ground base station, the computer readable program code comprising instructions which, when executed by a computer device or processor, perform and direct the steps of, instantiating, within a mobile user objective system enabled terminal, an instance of a mobile user objective system waveform, an instance of a layer one, the instance of the layer one including an emulation of a digital signal processor and an emulation of a field-programmable gate array, instantiating, within a mobile user objective system ground base station emulation server, an implementation of a generic discovery client server, an implementation of an internet key exchange session manager, an implementation of a session initiation protocol server, and an emulation of a ground base station, the emulation of the ground base station including an emulation of a radio base station and an emulation of a radio network controller, wherein the mobile user objective system enabled terminal is configured for communication with the mobile user objective system ground base station emulation server, the communication via, the instance of the mobile user objective system waveform, the instance of the layer one, and a data communication link between the mobile user objective system enabled terminal and the mobile user objective system ground base station emulation server.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The following description presents certain specific embodiments of the present invention. However, the present invention may be embodied in a multitude of different ways as defined and covered by the claims. In this description, reference is made to the drawings wherein like parts are designated with like numerals throughout.

Embodiments of the present invention emulate a ground base station of a Mobile User Objective System (MUOS). Embodiments may reside on a MUOS enabled terminal providing autonomous testing and communication capabilities for the MUOS enabled terminal. Additional embodiments of the present invention reside remotely from a plurality of MUOS enabled terminals capable of communicating with and testing of the remote MUOS enabled terminals.

Embodiments of the present invention emulate the MUOS networking stack in the Radio Base Station (RBS) and Radio Network Controller (RNC) portions of the ground base station. Additionally, embodiments emulate the High Assurance Internet Protocol Encryptor (HAIPE), Internet Key Exchange (IKE), and Generic Discovery Client (GDC) server found within the MUOS configured systems. Further, embodiments provide an ability to test Abstract Syntax Notation One (ASN.1) protocol messaging for satellite ranging, network acquisition, secure session establishment, and call placement. Additionally, embodiments of the present invention exercise portions of the MUOS codebase enabling accurate representation of the MUOS waveform. Further embodiments of the present invention may provide a configurable Layer 1 interface including: 1) simulated (Ethernet), 2) Line of Sight (LOS) implementation (Infrared/Radio Frequency (IF/RF)), and 3) a real MUOS Signal-in-Space (IF/RF).

Platforms within which embodiments of the present invention may operate may vary. It is contemplated herein multiple hardware devices may operate with and be tested by embodiments of the present invention. For example, one embodiment of the present invention may operate autonomously within a handheld MUOS enabled phone device enabling an operator to test the MUOS enabled device. An additional embodiment of the present invention may function within a MUOS enabled Joint Tactical Radio System (JTRS) terminal while yet an additional embodiment of the present may function in communication with an MUOS enabled ARC-210 radio mounted on an airborne platform.

Figure 1:
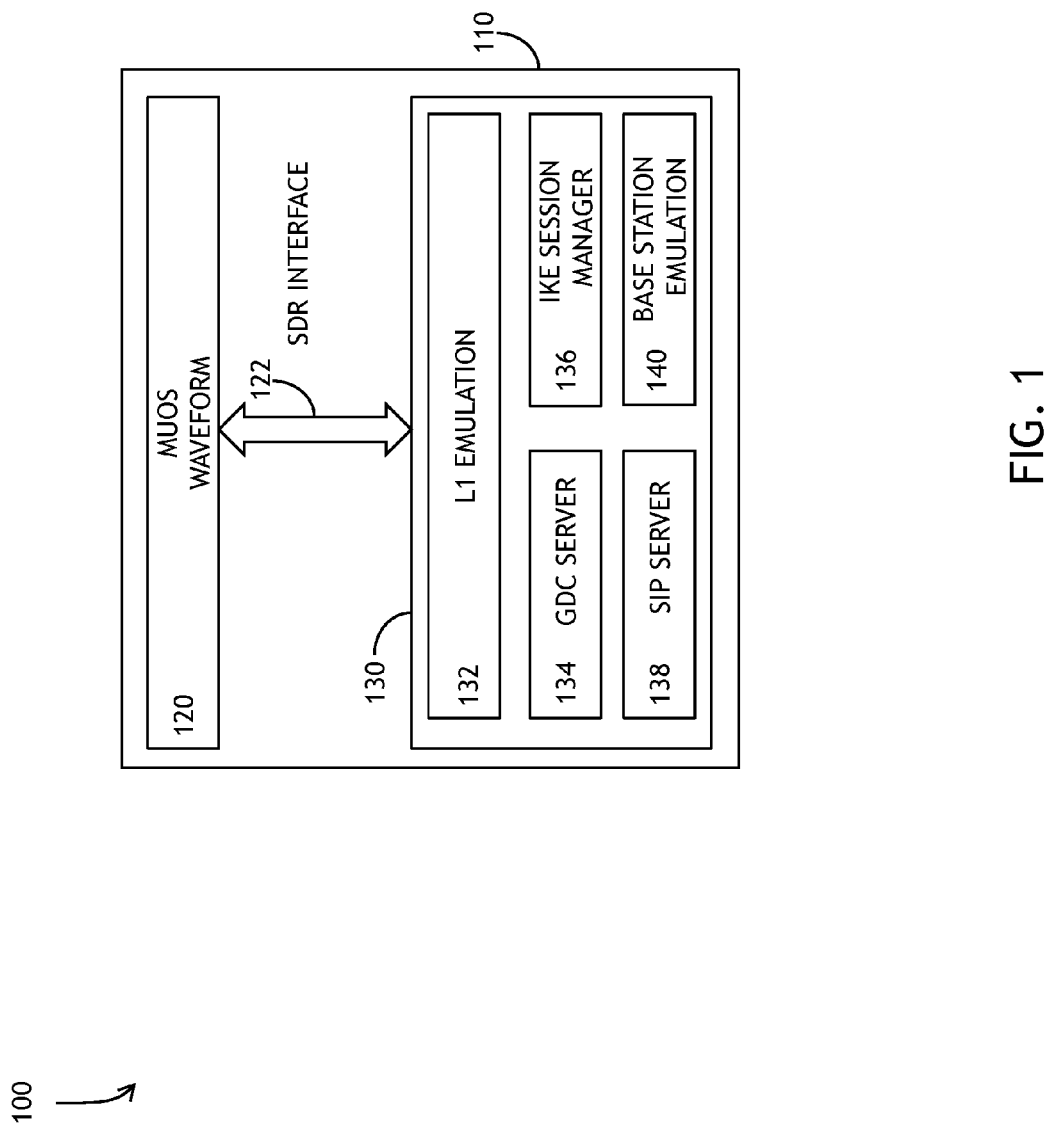
FIG. 1 is an overview of an exemplary mobile user objective system enabled terminal configured for autonomous ground base station emulation in accordance with an embodiment of the present invention.

Referring to FIG. 1, an overview of an exemplary mobile user objective system enabled terminal configured for autonomous ground base station emulation in accordance with an embodiment of the present invention is shown. System 100 includes embodiments where the bases station emulation executes on a single host platform (e.g. a single board).

System 100 includes MUOS enabled terminal 110, the MUOS enabled terminal 110 is configured for housing the components 130 of the ground base station emulation system. MUOS waveform 120 interfaces with the additional components 130 via Software Defined Radio (SDR) interface 122. Within MUOS enabled terminal 110 are components 130 configured for ground base station emulation.

An autonomous emulation (e.g. Single Board) as used herein may be defined as a system contained within a single radio and processor (e.g. a single computer system and software defined radio) and operate in isolation within the radio. The single board may emulate the base station to a specific operational point prior to a point where the radio becomes operational. With the single board system in operation within the radio, an operator may perform self-executed testing and automated built in testing within the MUOS enabled device without additional hardware.

Layer 1 (L1) emulation 132 includes a software emulation of the Waveform (WF) Digital Signal Processor/Field Programmable Gate Array (DSP/FPGA) Software Defined Radio (SDR) interface. To the Waveform 120 software, the emulation appears identical to the real DSP/FPGA SDR interface. No change is required in the Waveform 120 to alternate between the ground base station emulation and actual interfaces. This L1 emulation 132 also emulates the FPGA frame timer (signaled every 10 milliseconds) and the scheduling of MUOS frames. Output of L1 emulation 132 may be any available protocol (Ethernet, Radio Frequency, Serial, etc.).

System 100 implementation of Generic Discovery Client (GDC) server 134 emulates the dynamic discovery of the MUOS enabled encryption device. The GDS server 134 ensures seamless compatibility with High Assurance Internet Protocol Encrypter (HAIPE) that supports the MUOS specific GDS location services. GDS server 134 allows MUOS enabled terminals to register and locate remote terminal HAIPE information System 100 implementation of Internet Key Exchange (IKE) session manager 136 emulates a protocol that supports the MUOS specific IKE message options. This emulation allows MUOS enabled terminals to exchange encrypted packets and establish secure communication sessions for ground base station services.

System 100 implementation of Session Initiation Protocol (SIP) server 138 emulates an SIP server 138 with MUOS specific extensions. The SIP server 138 emulation allows the MUOS enabled terminals to perform MUOS SIP operations (Registration, Calling, etc.).

System 100 implementation of base station emulation 140 includes software emulation of MUOS Radio Access Network (RAN) functionality (e.g. one of the four worldwide RAN facilities). Base Station Emulation 140 also includes MUOS specific implementation of the MUOS Radio Base Station (RBS) and MUOS Radio Network Controller (RNC). Base Station Emulation 140 processes all outgoing messages from the Waveform 120 application and responds appropriately. Base Station Emulation 140 may support from Layer 1 to Layer 3 of the Universal Mobile Telecommunications System (UMTS) Third Generation Partnership Project (3GPP) specifications modified for MUOS.

In embodiments, each instance of the MUOS waveform 120 may include a concurrently running base station emulation including each of the components 130.

Figure 2:
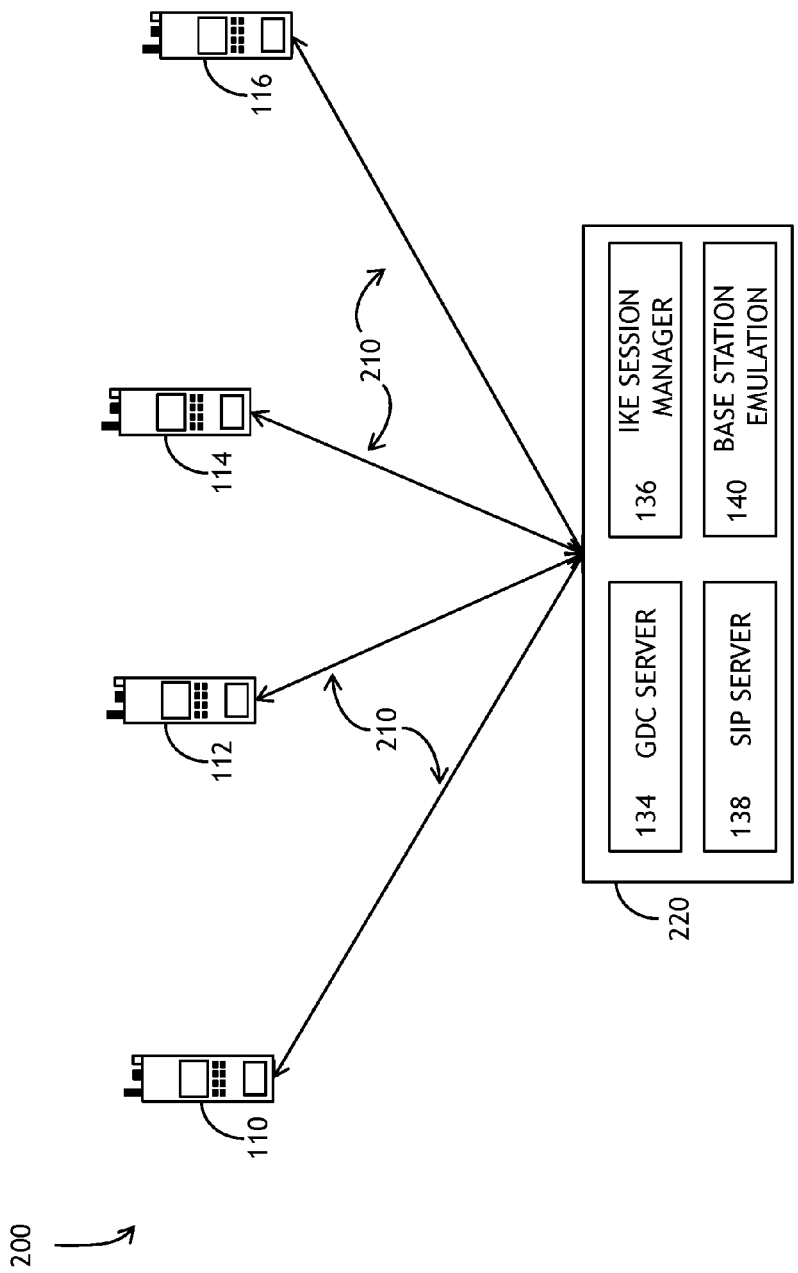
FIG. 2 is a diagram of multiple mobile user objective system enabled terminals configured for distributed ground base station emulation exemplary of an embodiment of the present invention.

Referring to FIG. 2, diagram of multiple mobile user objective system enabled terminals configured for distributed ground base station emulation exemplary of an embodiment of the present invention is shown. In distributed system 200, multiple MUOS enabled terminals/radios are configured for testing and communication via ground base station emulation server 220. As with the autonomous system 100, distributed system 200 employs GDS server 134, IKE session manager 136, SIP server 138, and base station emulation 140. Unlike autonomous system 100, ground base station emulation server 220 of distributed system 200 resides remotely from each of the MUOS enabled terminals 110, 112, 114, and 116.

Distributed system 200 includes ground base station emulation server 220 in data communication with each MUOS enabled terminal 110 via communication link 210. Communication link 210 may be a plurality of link protocols including RF, Ethernet, and Serial etc.

In distributed system 200, each MUOS enabled terminal 110 may remotely interface with the MUOS server 220 via communications link 210 to externally connect multiple MUOS enabled terminals 110 to MUOS server 220 and to another terminal 112. For example, should an operator of MUOS enabled terminal 110 desire communication with MUOS enabled terminal 112, this connection may be enabled through MUOS server 220. Similarly, should operator of MUOS enabled terminal 116 desire to test the terminal 116, communication link 210 would allow MUOS enabled terminal 116 to communicate with MUOS server 220.

Figure 3:
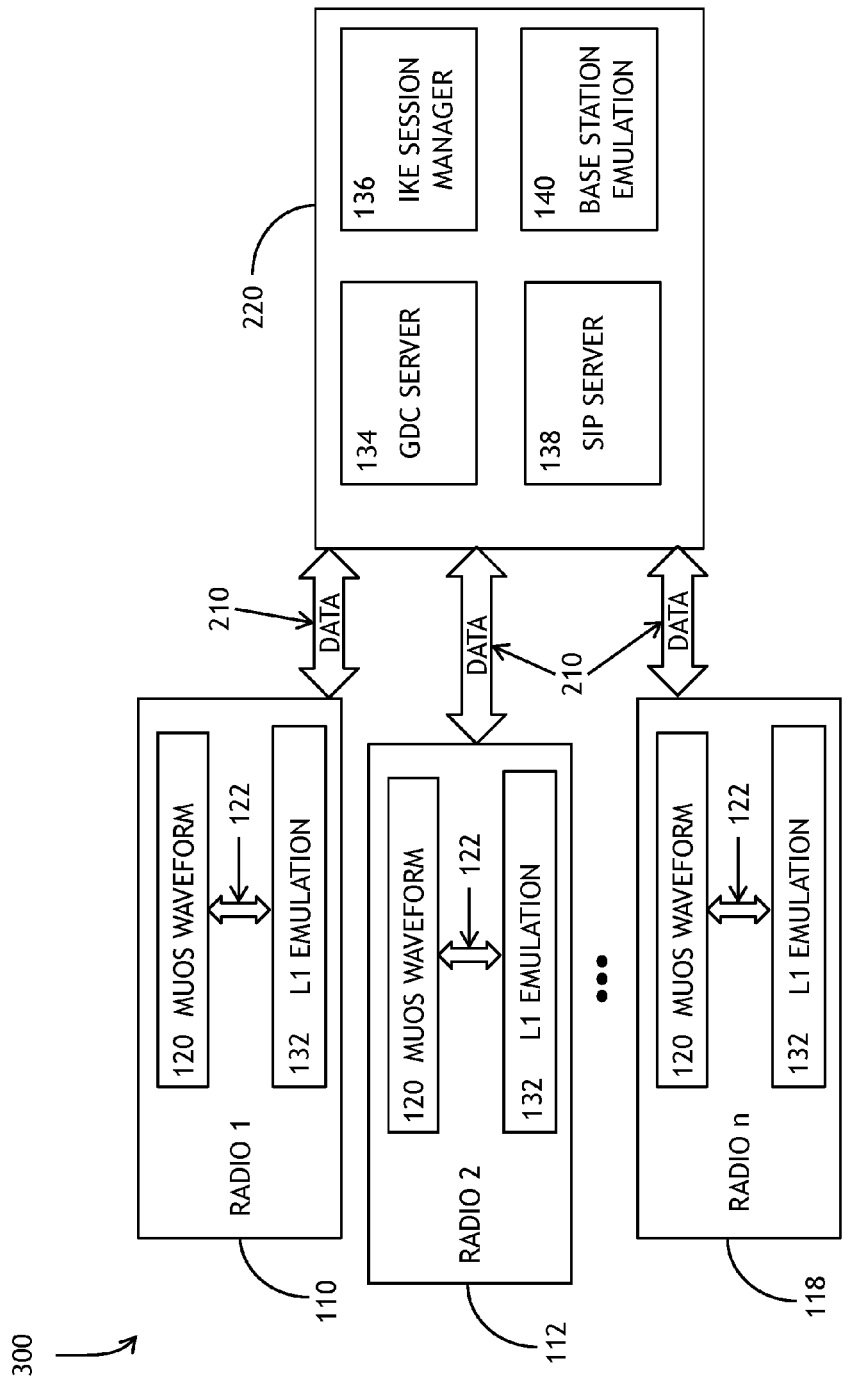
FIG. 3 is a detailed diagram of multiple mobile user objective system enabled terminals configured for distributed base station emulation exemplary of an embodiment of the present invention.

Referring to FIG. 3, a detailed diagram of multiple mobile user objective system enabled terminals configured for distributed base station emulation exemplary of an embodiment of the present invention is shown. MUOS enabled terminals 110, 112, and 118 are in data communication with ground base station emulation server 220 via communication link 210. Within each of the MUOS enabled terminals 110-118 (labeled RADIO 1, RADIO 2 and RADIO n), MUOS waveform 120 communicates with L1 emulation 132 via SDR interface 122.

In ground base station emulation operation, MUOS enabled terminal 112 may be powered on by a user. The user may desire to enable a test sequence for the MUOS enabled terminal 112. Within the test sequence Radio 2 may connect with MUOS waveform 120 and through SDR interface 122 with L1 emulation 132. Radio 2 may further connect via communication link 210 with MUOS server 220. Within MUOS server 220, GDS server 134, IKE session manager 136, SIP server 138, and base station emulator 140 all act to emulate communication with an actual ground base station. Once the test sequence is complete, the user may activate actual communication with an actual ground base station via the actual MUOS waveform.

Figure 4:
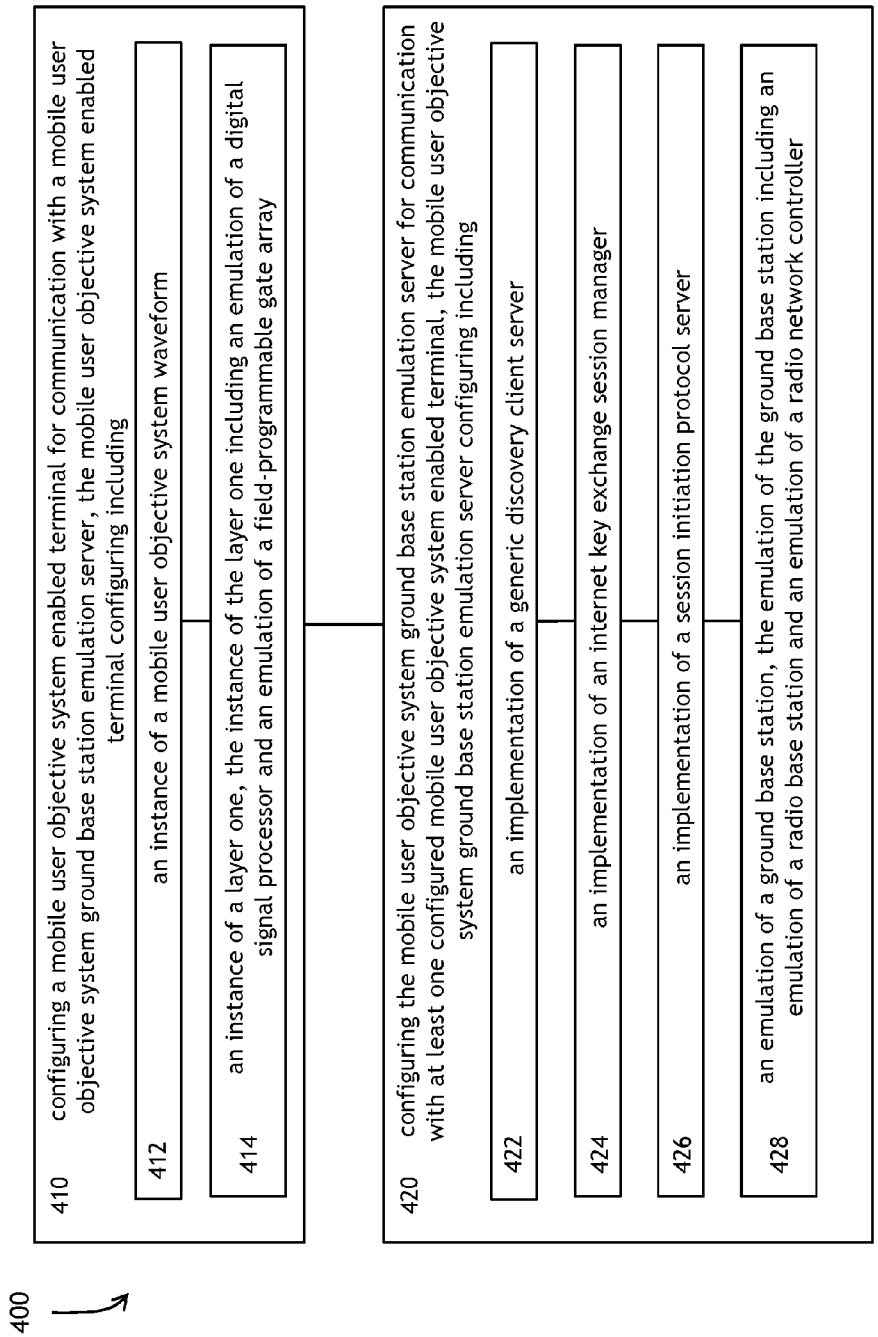
FIG. 4 is a flow diagram of a method for emulation of a Mobile User Objective System ground base station representative of an embodiment of the present invention.

Referring to FIG. 4, a flow diagram of a method for emulation of a Mobile User Objective System ground base station representative of an embodiment of the present invention is shown. Method 400 begins at step 410 with configuring a mobile user objective system enabled terminal for communication with a mobile user objective system ground base station emulation server, the mobile user objective system enabled terminal configuring including, at step 412, an instance of a mobile user objective system waveform, and at step 414, an instance of a layer one, the instance of the layer one including an emulation of a digital signal processor and an emulation of a field-programmable gate array. Method 400 continues at step 420 with configuring the mobile user objective system ground base station emulation server for communication with at least one configured mobile user objective system enabled terminal, the mobile user objective system ground base station emulation server configuring including, at step 422 an implementation of a generic discovery client server, and at step 424, an implementation of an internet key exchange session manager, and at step 426, an implementation of a session initiation protocol server, and at step 428 an emulation of a ground base station, the emulation of the ground base station including an emulation of a radio base station and an emulation of a radio network controller.

CONCLUSION

Specific blocks, sections, devices, functions, processes and modules may have been set forth. However, a skilled technologist will realize that there are many ways to partition the system, and that there are many parts, components, processes, modules or functions that may be substituted for those listed above.

While the above detailed description has shown, described and pointed out the fundamental novel features of the invention as applied to various embodiments, it will be understood that various omissions and substitutions and changes in the form and details of the system illustrated may be made by those skilled in the art, without departing from the intent of the invention. The foregoing description details certain embodiments of the invention. It will be appreciated, however, that no matter how detailed the foregoing appears, the invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method for emulation of a mobile user objective system ground base station, comprising:
    configuring a mobile user objective system enabled terminal for communication with a mobile user objective system ground base station emulation server, the mobile user objective system enabled terminal configuring including:
        an instance of a mobile user objective system waveform;
        an instance of a layer one, the instance of the layer one including an emulation of a digital signal processor or field programmable gate array software defined radio interface;
    configuring the mobile user objective system ground base station emulation server for communication with at least one configured mobile user objective system enabled terminal, the mobile user objective system ground base station emulation server configuring including:
        an implementation of a generic discovery client server;
        an implementation of an internet key exchange session manager;
        an implementation of a session initiation protocol server; and
        an emulation of a ground base station, the emulation of the ground base station including an emulation of a radio base station and an emulation of a radio network controller;
    wherein the mobile user objective system enabled terminal communicates via the instance of the mobile user objective system waveform and the instance of the layer one with the mobile user objective system ground base station emulation server, the communication emulates an actual communication with an actual mobile user objective system ground base station.

2. The method for emulation of a mobile user objective system ground base station of claim 1, wherein the mobile user objective system enabled terminal is further configured for autonomous communication and testing with a mobile user objective system ground base station emulation residing within the mobile user objective system terminal, the mobile user objective system enabled terminal configuring including:
    an implementation of a generic discovery client server;
    an implementation of an internet key exchange session manager;
    an implementation of a session initiation protocol server; and
    an emulation of a ground base station, the emulation of the ground base station including an emulation of a radio base station and an emulation of a radio network controller.

3. The method for emulation of a mobile user objective system ground base station of claim 1, wherein the instance of a mobile user objective system waveform further comprises an instance of a wideband code division multiple access waveform.

4. The method for emulation of a mobile user objective system ground base station of claim 1, wherein the instance of the layer one further comprises an emulation requiring no change to the mobile user objective system waveform to alternate between communication with the emulation of the mobile user objective system ground base station and communication with an actual mobile user objective system ground base station.

5. The method for emulation of a mobile user objective system ground base station of claim 1, wherein the mobile user objective system ground base station emulation server further comprises a separate host processor, the separate host processor configured for data communication with the mobile user objective system enabled terminal.

6. The method for emulation of a mobile user objective system ground base station of claim 1, wherein the actual mobile user objective system ground base station is one of four worldwide ground base stations.

7. The method for emulation of a mobile user objective system ground base station of claim 1, wherein the mobile user objective system enable terminal is further configured to communicate with another of the mobile user objective system enabled terminal.

8. A system for emulation of a mobile user objective system ground base station, comprising:
    a mobile user objective system enabled terminal configured for communication with a mobile user objective system ground base station emulation server, the mobile user objective system enabled terminal including a terminal non-transitory computer readable medium having terminal computer readable program code embodied therein for emulation of a mobile user objective system ground base station, the terminal computer readable program code comprising instructions which, when executed by a terminal processor, instantiate:
        an instance of a mobile user objective system waveform;
        an instance of a layer one, the instance of the layer one including an emulation of a digital signal processor or field programmable gate array software defined radio interface;
    the mobile user objective system ground base station emulation server configured for communication with at least one configured mobile user objective system enabled terminal, the mobile user objective system base station emulation server including a server non-transitory computer readable medium having server computer readable program code embodied therein for emulation of a mobile user objective system ground base station, the server computer readable program code comprising instructions which, when executed by a server processor, instantiate:
        an implementation of a generic discovery client server;
        an implementation of an internet key exchange session manager;
        an implementation of a session initiation protocol server; and
        an emulation of a ground base station, the emulation of the ground base station including an emulation of a radio base station and an emulation of a radio network controller;
    wherein the mobile user objective system enabled terminal communicates via the instance of the mobile user objective system waveform and the instance of the layer one with the mobile user objective system ground base station emulation server, the communication emulates an actual communication with an actual mobile user objective system ground base station.

9. The system for emulation of a mobile user objective system ground base station of claim 8, wherein the mobile user objective system enabled terminal is further configured for autonomous communication and testing with a mobile user objective system ground base station emulation residing within the mobile user objective system terminal, the terminal computer readable program code comprising further instructions which, when executed by the terminal processor, instantiate:
- an implementation of a generic discovery client server;
- an implementation of an internet key exchange session manager;
- an implementation of a session initiation protocol server; and
- an emulation of a ground base station, the emulation of the ground base station including an emulation of a radio base station and an emulation of a radio network controller.

10. The system for emulation of a mobile user objective system ground base station of claim 8, wherein the mobile user objective system enabled terminal is further configured to communicate with another of the mobile user objective system enabled terminal.

11. The system for emulation of a mobile user objective system ground base station of claim 8, wherein the instance of a mobile user objective system waveform further comprises an instance of a wideband code division multiple access waveform.

12. The system for emulation of a mobile user objective system ground base station of claim 8, wherein the instance of the layer one further comprises an emulation requiring no change to the mobile user objective system waveform to alternate between communication with the emulation of the mobile user objective system ground base station and communication with an actual mobile user objective system ground base station.

13. The system for emulation of a mobile user objective system ground base station of claim 8, wherein the mobile user objective system ground base station emulation server further comprises a separate host processor, the separate host processor configured for data communication with the mobile user objective system enabled terminal.

14. The system for emulation of a mobile user objective system ground base station of claim 8, wherein the actual mobile user objective system ground base station is one of four worldwide ground base stations.

15. A non-transitory computer readable medium having computer readable program code embodied therein for emulation of a mobile user objective system ground base station, the computer readable program code comprising instructions which, when executed by a computer device or processor, perform and direct the steps of:
- instantiating, within a mobile user objective system enabled terminal:
  - an instance of a mobile user objective system waveform;
  - an instance of a layer one, the instance of the layer one including an emulation of a digital signal processor or field programmable gate array software defined radio interface;
- instantiating, within a mobile user objective system ground base station emulation server:
  - an implementation of a generic discovery client server;
  - an implementation of an internet key exchange session manager;
  - an implementation of a session initiation protocol server; and
  - an emulation of a ground base station, the emulation of the ground base station including an emulation of a radio base station and an emulation of a radio network controller;
- wherein the mobile user objective system enabled terminal is configured for communication with the mobile user objective system ground base station emulation server, the communication via:
  - the instance of the mobile user objective system waveform,
  - the instance of the layer one; and
  - a data communication link between the mobile user objective system enabled terminal and the mobile user objective system ground base station emulation server.

16. The non-transitory computer readable medium of claim 15, wherein the mobile user objective system enabled terminal is further configured for autonomous communication and testing with a mobile user objective system ground base station emulation residing within the mobile user objective system terminal, the mobile user objective system enabled terminal further configured to include:
- an implementation of a generic discovery client server;
- an implementation of an internet key exchange session manager;
- an implementation of a session initiation protocol server; and
- an emulation of a ground base station, the emulation of the ground base station including an emulation of a radio base station and an emulation of a radio network controller.

17. The non-transitory computer readable medium of claim 15, wherein the mobile user objective system enabled terminal is further configured to communicate with another of the mobile user objective system enabled terminal.

18. The non-transitory computer readable medium of claim 15, wherein the instance of a mobile user objective system waveform further comprises an instance of a wideband code division multiple access waveform.

19. The non-transitory computer readable medium of claim 15, wherein the instance of the layer one further comprises an emulation requiring no change to the mobile user objective system waveform to alternate between communication with the emulation of the mobile user objective system ground base station and communication with an actual mobile user objective system ground base station.

20. The non-transitory computer readable medium of claim 15, wherein the mobile user objective system ground base station emulation server further comprises a separate host processor, the separate host processor configured for data communication with the mobile user objective system enabled terminal.

* * * * *